(12) United States Patent
Pandey (10) Patent No.: US 9,780,815 B2
(45) Date of Patent: Oct. 3, 2017

(54) MULTI-TONES NARROW BAND RF NOISE ELIMINATION THROUGH ADAPTIVE ALGORITHM

(71) Applicant: NXP B.V., Eindhoven (NL)

(72) Inventor: Sujan Pandey, Eindhoven (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 14/992,735

(22) Filed: Jan. 11, 2016

(65) Prior Publication Data

US 2017/0201276 A1 Jul. 13, 2017

(51) Int. Cl.
| | | |
|---|---|---|
| H04B 1/10 | (2006.01) | |
| H04B 3/23 | (2006.01) | |
| H04L 25/03 | (2006.01) | |
| H03H 21/00 | (2006.01) | |

(52) U.S. Cl.
CPC .......... H04B 1/10 (2013.01); H04B 3/23 (2013.01); H04L 25/03019 (2013.01); H03H 2021/0059 (2013.01)

(58) Field of Classification Search
CPC .... H04B 1/10; H04B 3/23; H03H 2021/0059; H04L 25/03019
See application file for complete search history.

(56) References Cited

U.S. PATENT DOCUMENTS

| | | | | |
|---|---|---|---|---|
| 8,861,663 B1* | 10/2014 | Sedarat | ............ | H04L 25/03012 375/350 |
| 8,897,278 B2* | 11/2014 | Kimura | ............... | H04L 27/2655 370/338 |
| 2006/0133303 A1* | 6/2006 | Shida | ........................ | H04B 3/23 370/286 |
| 2006/0182014 A1* | 8/2006 | Lusky | ..................... | H04B 3/23 370/201 |
| 2007/0082638 A1* | 4/2007 | Panfilov | ............... | H04B 1/7101 455/224 |
| 2008/0045161 A1* | 2/2008 | Lee | ......................... | H03F 3/217 455/73 |
| 2009/0104946 A1* | 4/2009 | Khandourl | .......... | H04M 1/2535 455/569.2 |
| 2011/0228838 A1* | 9/2011 | Yang | ........................ | H04B 3/23 375/232 |
| 2011/0305306 A1 | 12/2011 | Hu et al. | | |

(Continued)

FOREIGN PATENT DOCUMENTS

EP 0 926 839 A2 6/1999

OTHER PUBLICATIONS

Widrow, B. et al. "Adaptive noise cancelling: Principles and applications", IEEE, vol. 63, No. 12, pp. 1692-1716 (Dec. 1975).

(Continued)

*Primary Examiner* — David B. Lugo
(74) *Attorney, Agent, or Firm* — Rajeev Madnawat (57) ABSTRACT

Various embodiments relate to a device for reducing noise in a received signal, the device including a memory; a processor configured to: receive a signal containing narrow band noise which was transmitted over a channel and received at an analog front end; add two separate delays to the signal to generate a first delayed signal and a second delayed signal; apply an adaptive noise cancellation using the first delayed signal and the second delayed signal to estimate the narrow band noise; and remove the narrow band noise based upon the estimated narrow band noise.

18 Claims, 8 Drawing Sheets

(56) References Cited

U.S. PATENT DOCUMENTS

2012/0256639 A1* 10/2012 Pausini ............ G01R 31/31709
                                                                             324/613
2016/0225388 A1* 8/2016 Nelke ...................... H04R 3/00

OTHER PUBLICATIONS

Lord, R. T. et al. "Efficient RFI suppression in SAR using LMS adaptive filter integrated with range/Doppler algorithm", Electronics Letters, vol. 35, No. 8, pp. 629-630 (Apr. 1999).

Shanbhag, N. R. "Relaxed look-ahead pipelined LMS adaptive filters and their application to ADPCM coder", IEEE Transactions on Circuits and Systems II: Analog and Digital Signal Processing, vol. 40, No. 12, pp. 753-766 (Dec. 1993).

* cited by examiner

MULTI-TONES NARROW BAND RF NOISE ELIMINATION THROUGH ADAPTIVE ALGORITHM

TECHNICAL FIELD

Various embodiments disclosed herein relate generally to noise reduction.

BACKGROUND

Electronic communications oftentimes use cables and other wires to send data across either long or short distances. The wiring may take place on the Open Systems Interconnection (OSI) model layer 1 or the physical layer often called PHY. For example, Ethernet uses a serial communications PHY as well Universal Serial Bus (USB). Machine to machine communications may thus transfer data from one end to another using these wires, for example using copper. The cables may receive some Radio Frequency (RF) noise. The noise may enter the PHY layer.

SUMMARY

A brief summary of various embodiments is presented below. Some simplifications and omissions may be made in the following summary, which is intended to highlight and introduce some aspects of the various embodiments, but not to limit the scope of the invention. Detailed descriptions of a preferred embodiment adequate to allow those of ordinary skill in the art to make and use the inventive concepts will follow in later sections.

Various embodiments described herein relate to a device for reducing noise in a received signal, the device including a memory; a processor configured to: receive a signal containing narrow band noise which was transmitted over a channel and received at an analog front end; add two separate delays to the signal to generate a first delayed signal and a second delayed signal; apply an adaptive noise cancellation using the first delayed signal and the second delayed signal to estimate the narrow band noise; and remove the narrow band noise based upon the estimated narrow band noise.

Various embodiments described herein relate to a method for reducing noise in a received signal, the method including receiving a signal containing narrow band noise which was transmitted over a channel and received at an analog front end; adding two separate delays to the signal to generate a first delayed signal and a second delayed signal; applying an adaptive noise cancellation using the first delayed signal and the second delayed signal to estimate the narrow band noise; and removing the narrow band noise based upon the estimated narrow band noise.

BRIEF DESCRIPTION OF THE DRAWINGS

In order to better understand various embodiments, reference is made to the accompanying drawings, wherein.

To facilitate understanding, identical reference numerals have been used to designate elements having substantially the same or similar structure or substantially the same or similar function.

DETAILED DESCRIPTION

The description and drawings presented herein illustrate various principles. It will be appreciated that those skilled in the art will be able to devise various arrangements that, although not explicitly described or shown herein, embody these principles and are included within the scope of this disclosure. As used herein, the term, "or" refers to a non-exclusive or (i.e., and/or), unless otherwise indicated (e.g., "or else" or "or in the alternative"). Additionally, the various embodiments described herein are not necessarily mutually exclusive and may be combined to produce additional embodiments that incorporate the principles described herein.

When a received signal is noisy as a result of narrow band RF noise, the receiver performance may be poor. The narrow band RF noise may affect performance of adaptive filters such as an equalizer, echo canceller, and timing recovery.

Low frequency components such as Direct Current (DC), for example, may be present in wired communications interfaces, while low frequency component free signaling may be desired. Long sequences of received symbols when averaged for a long period (such as infinite) may be low frequency component free. But if one observes a sequence of data for a short time interval, it may not be low frequency component free. The low frequency component must be compensated for which may occur typically using a high pass coupling filter, for example, a transformer or a coupling capacitor.

A coupling capacitor may charge and discharge symbols on a line. For example, symbols such +1, 0, or −1 may be affected as the receiver integrates the long run length. Main sources of narrow band RF noise in a serial communication system may include 1) Bulk Current Injection (BCI)/Direct Power Injection (DPI) and 2) Residual Baseline Wander (BLW) due to the coupling networks. The presence of narrow band RF noise in data may degrade the Signal to Noise Ratio (SNR) and results in longer startup time, partial cancellation due to Inter-Symbol Interference (ISI), and/or near-end/far-end echo or crosstalk. When a system's SNR becomes poor, the performance of timing recovery may also degrade and not be able to meet the worst case channel requirements.

Some embodiments may include techniques to cancel not only a single tone, but may cancel multi-tone narrow band RF noise. This noise may originate from BCI, DPI, BLW or combinations of these or other types of noise. Low frequency components may be eliminated through adaptive algorithms at the receiver. Complete removal of residual low frequency RF noise may increase Analog to Digital Converter (ADC) dynamic range. Similarly one may want to make sure that adaptive algorithms are tolerant to low frequency noise. Efficiency in terms of area, power, and complexity is also a goal.

Figure 1:
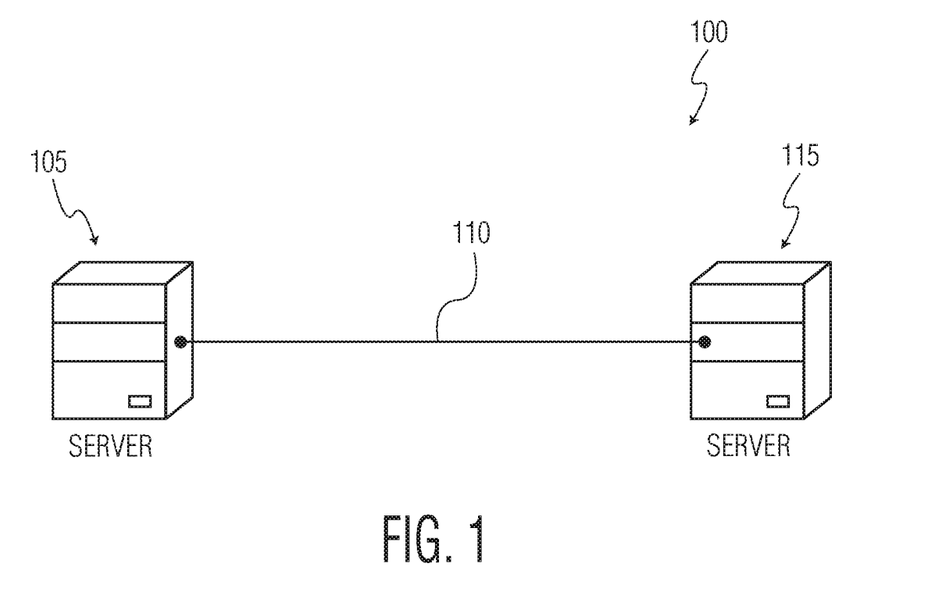
FIG. 1 illustrates an example of a system for implementing the noise elimination scheme.

FIG. 1 illustrates an exemplary environment for implementing noise reduction algorithms 100. Environment 100 may include system 105, connector 110, and system 115. Systems 105 and 115 may be any kind of system such as a computer, laptop, server, receiver, multimedia receiver, amplifier, etc. Connector 110 may be any kind of connection such as a wired connection comprising copper twisted wire. Connector 110 may be an Ethernet connection such as 4-pair copper structured cabling, category 5 cable. Similarly, connector 110 may be avionics full-duplex switched Ethernet and time triggered Ethernet.

Figure 1A:
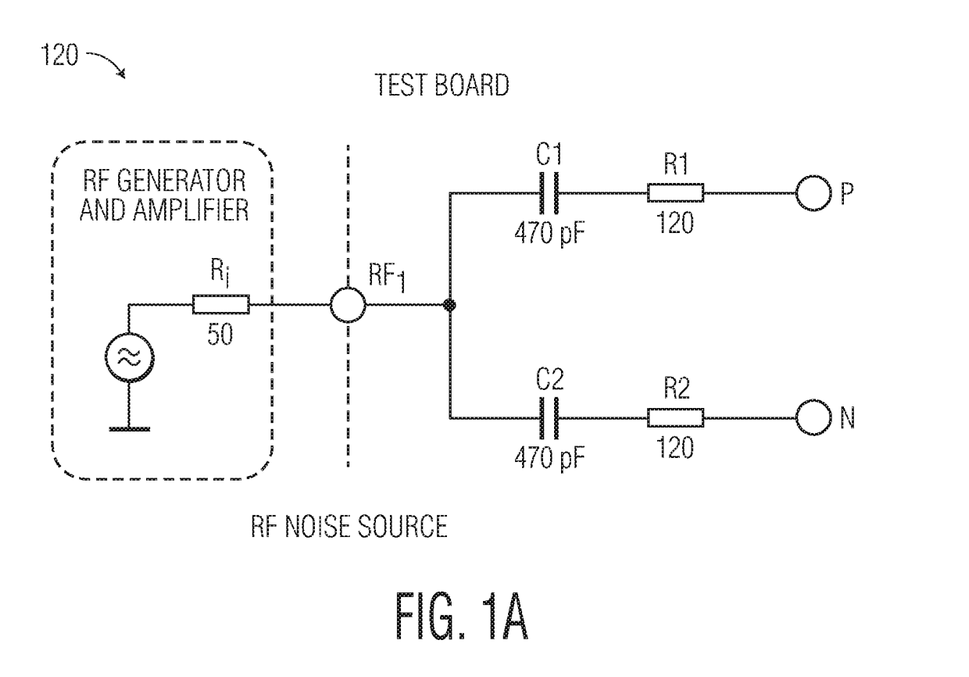
FIG. 1A illustrates an exemplary test setup.

FIG. 1A illustrates an exemplary test setup 120. Exemplary test setup may be an Immunity test setup including parameters;
RF power=36 dBm
Freq.→1 Hz to 1 GHz
RF noise power injected through a coupling network with capacitors and resistors After common-mode to differential mode conversion, differential RF noise may not be seen at the receiver.

Figure 1B:
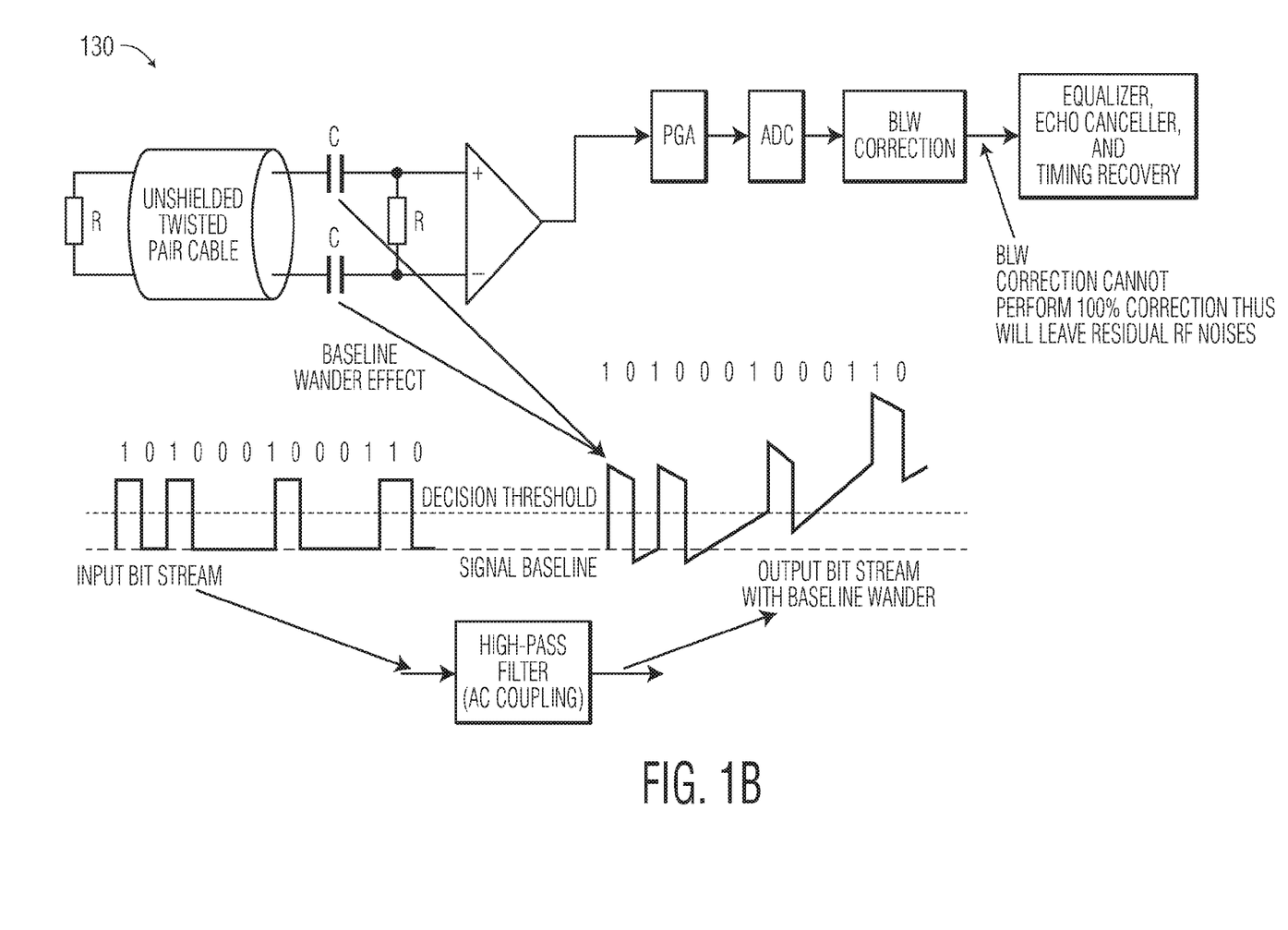
FIG. 1B illustrates noise due to BLW effect.

FIG. 1B illustrates noise due to BLW effect 130. Noise 130 may be Residual RF noise due to BLW effect. Noise 130 may include types of noise which are to be compensated for in different embodiments.

Figure 2:
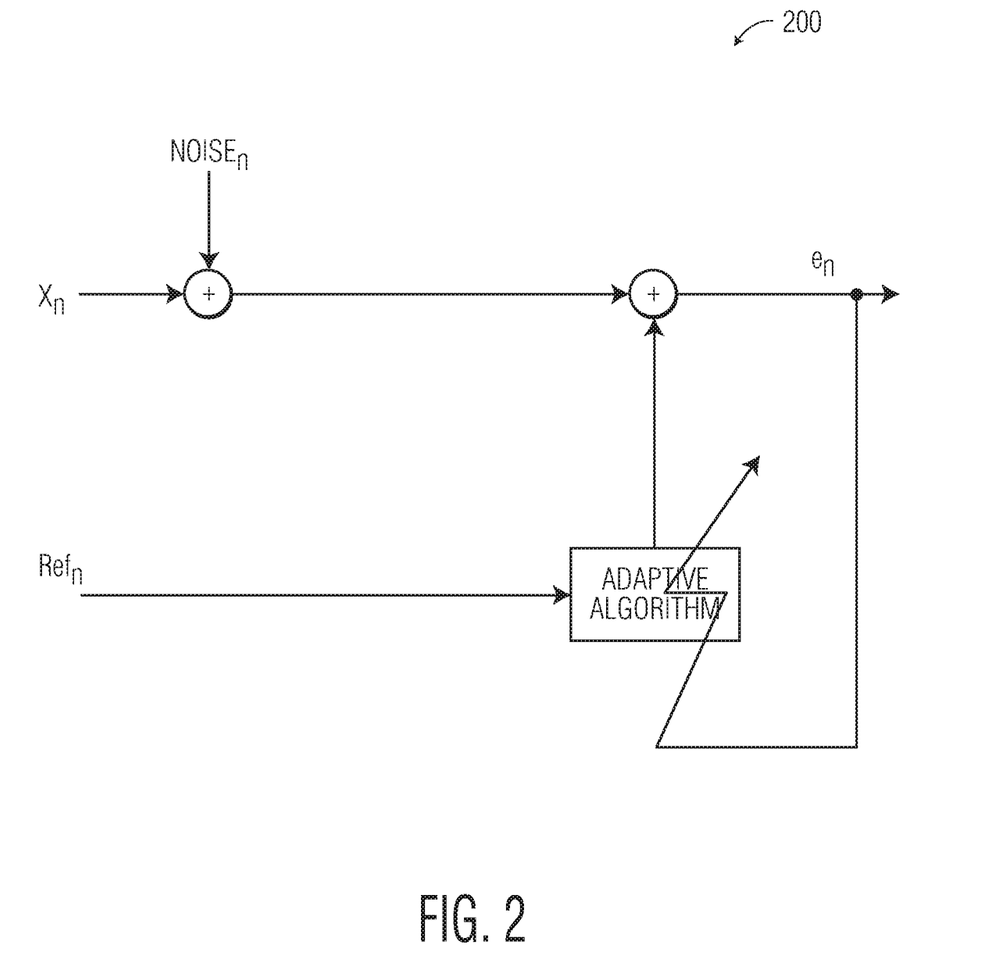
FIG. 2 illustrates an example of related art adaptive noise cancellation.

FIG. 2 illustrates an example of related art basic adaptive noise cancellation 200. Basic adaptive noise cancellation typically uses a reference signal to eliminate the added noise. In basic noise cancellation, one may only cancel the single tone narrow band RF noise. Basic noise cancellation typically does not cancel multi-tone narrow band RF noise. In exemplary basic adaptive noise cancellation 200, reference signal $Ref_n$ is used as an input to an adaptive algorithm. The input signal $x_n$ is modified with $Noise_n$ from the environment and the modified signal is combined with the output of the adaptive algorithm to produce an estimate $e_n$ of input signal $x_n$.

Figure 3:
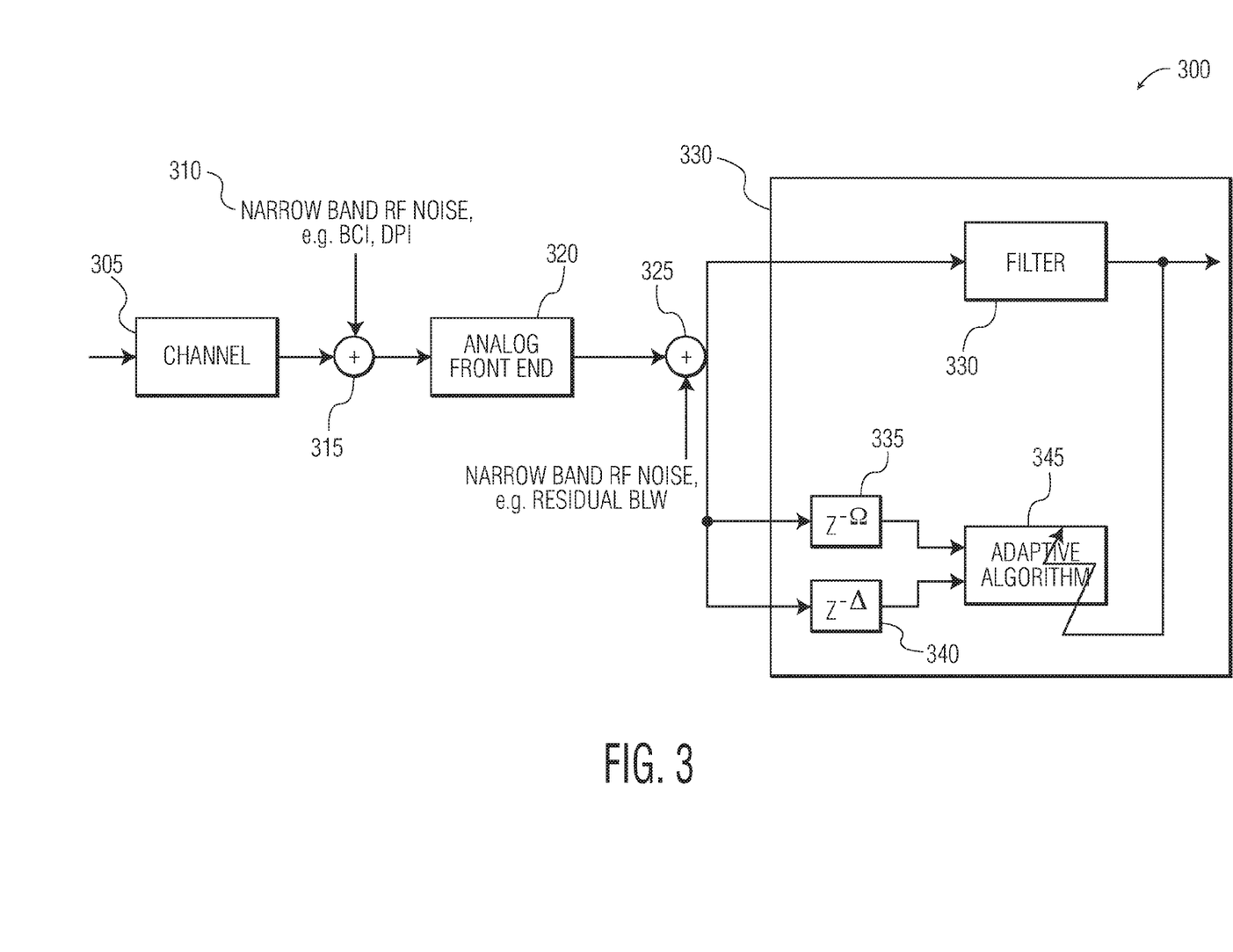
FIG. 3 illustrates an example an embodiment of adaptive noise cancellation using delays.

FIG. 3 illustrates an example embodiment of adaptive noise cancellation using delays 300. Embodiment 300 may include channel 305, narrow band RF noise input 310, which is added to the signal on the channel 305, analog front end 320, narrow band RF noise 350 which is added 325 to the output of the analog front end 320, Adaptive multi-tone Narrow Band RF Noise canceller 328, filter 330, omega delay 335, delta delay 340, and adaptive algorithm 345.

There are two delay blocks that are added so that you do not need a reference signal, but rather fact that the data symbols are not correlated, but that the noise is somewhat correlated may be used to estimate and cancel the narrow band noise.

A clean signal may enter channel 305 from, for example, system 105. Channel 305 may be connector 110, for example. On the channel, any type of noise such as narrow band RF noise 310 may be added 315 to the clean signal in step 315 and then input into the analog front end 320 as a distorted signal or the noise may be added before the channel. Analog front end 320 may be on system 115, for example. The distorted signal may further be distorted 325 by narrow band RF noise 350 inside the receiver and input to Adaptive multi-tone Narrow Band RF Noise canceller 328.

Adaptive multi-tone Narrow Band RF Noise canceller 328 may include filter 330, omega delay 335, delta delay 340, and adaptive algorithm 345. Adaptive algorithm 345 may be any adaptive known noise reduction algorithm such as Least Mean Square (LMS), Recursive Least Squares Filter (RLS), sign LMS, sign-sign LMS. Filter 330 may be a 1-tap filter using a LMS algorithm, for example.

Two delay blocks, omega delay 335 and delta delay 340 may be added so that one does not require a reference signal to reduce multi-tones narrow band RF noise. Correlation may be achieved by tuning the values of $\Omega \geq 1$ and $\Delta \geq 1$. The two delays may be added to the signal containing transmitted symbols and the added noise. This signal may be a transverse signal with noise added on top of it.

The signal, after adding the delays may be cross correlated. When two signals have full orthogonality, then their cross correlations will be zero. The sampled signal along with the multiple delays may be fed into any adaptive noise reduction algorithm. One may find the cross correlation between the two signals. For example, the run length may be very far from one symbol to the next on a distorted signal. One may then find the correlation between the two signals in order to estimate the narrow band noise.

In one example, the adaptive algorithm may be a LMS algorithm where:

$$h(n+1)=h(n)+uX(n)e^*(n);$$

h(n+1) represents a new coefficient;
h(n) represents a previous coefficient;
u represents a gain factor;
x(n) represents signal samples; and
e*(n) represents error.

The previous coefficient h(n) may be multiplied with the omega delay and subtracted from the delta delay to produce the error e*(n). X(n) may be time delayed by omega delay. e*(n) and X(n) may be multiplied and then amplified by gain factor u. This output signal may be input into the adaptive filter along with a new coefficient.

Figure 4:
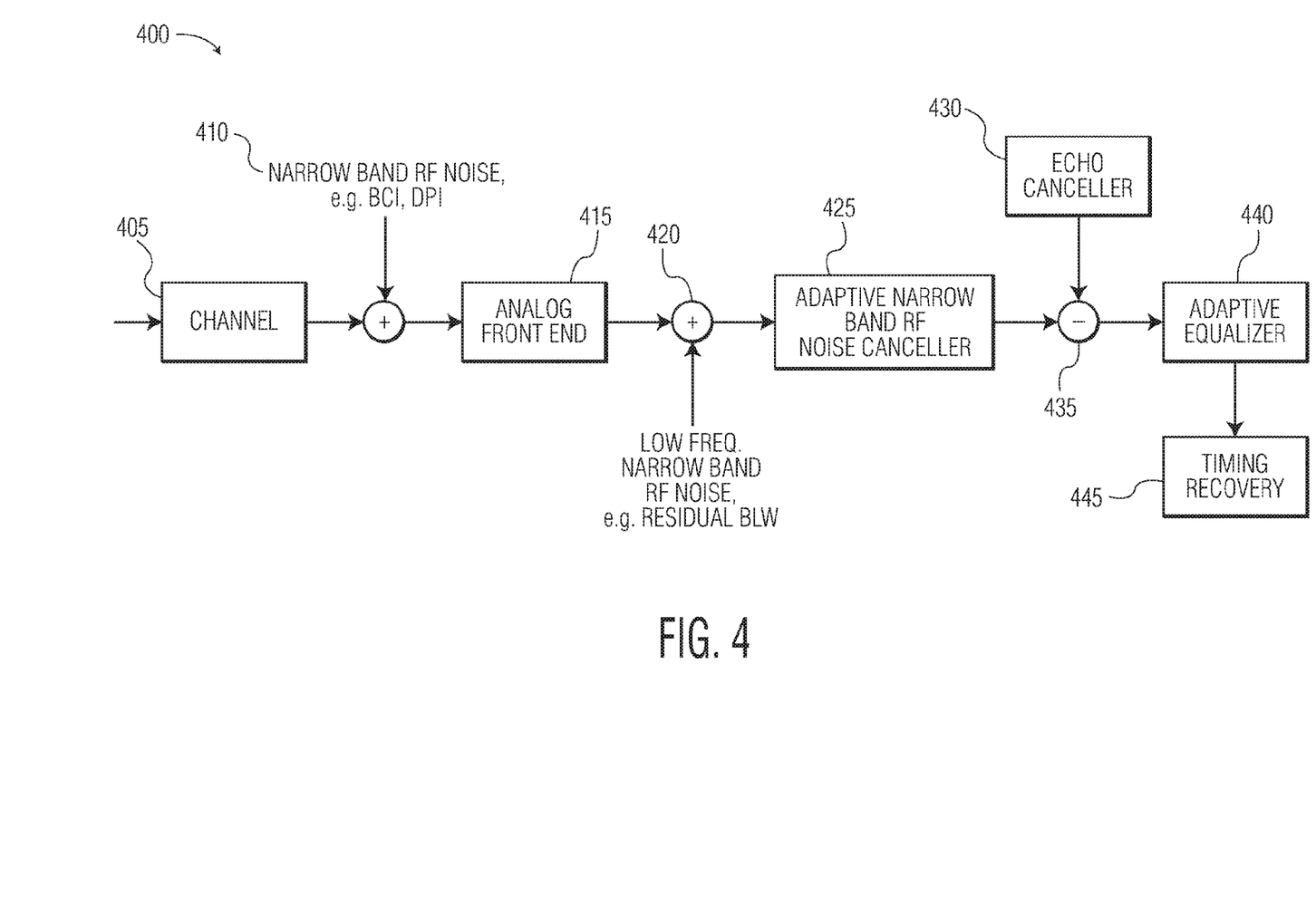
FIG. 4 illustrates an embodiment of adaptive noise cancellation.

FIG. 4 illustrates an embodiment of adaptive noise cancellation 400. Embodiment 400 may include channel 405, narrow band RF noise 410, analog front end 415, low frequency narrow band RF noise 420, adaptive narrow band RF noise canceller 425, echo canceller 430, subtractor 435, adaptive equalizer 440, and timing recovery 445.

In embodiment 400, noise may be removed before echo canceller 430, adaptive equalizer 440, and timing recovery 445 steps are performed. The noise canceller 425 may include the elements discussed in FIG. 3. A signal may enter channel 405, which may be connector 110. The signal may be distorted by narrow band RF noise 410 before entering analog front end 415. Narrow band RF noise 410 may be BCI or DPI, for example. A signal with noise may then enter analog front end 415, which may be part of system 115, for example. The modified signal may have multi-tone narrow band RF noise suppressed or eliminated when leaving noise canceller 425. At step 435, the noise suppressed signal may then be modified by echo cancellation from echo canceller 430. Echo canceller 430 may use any acoustic echo suppression (AES), acoustic echo cancellation (AEC), and line echo cancellation (LEC) techniques.

The signal may then be modified by adaptive equalizer 440. Adaptive equalizer 440 may be any type of equalizer as described above such as a linear equalizer or a decision feedback equalizer. The adaptive equalizer 440 may update the equalizer parameters, for example, filter coefficients. The adaptive equalizer 440 may use, for example, cost functions such as Mean Squared Error (MSE). Next, carrier recovery may be performed in timing recovery 445. In timing recovery 445, frequency and phase differences between a carrier wave and the receiver's oscillator may be estimated and compensated for in order to complete demodulation.

Figure 5:
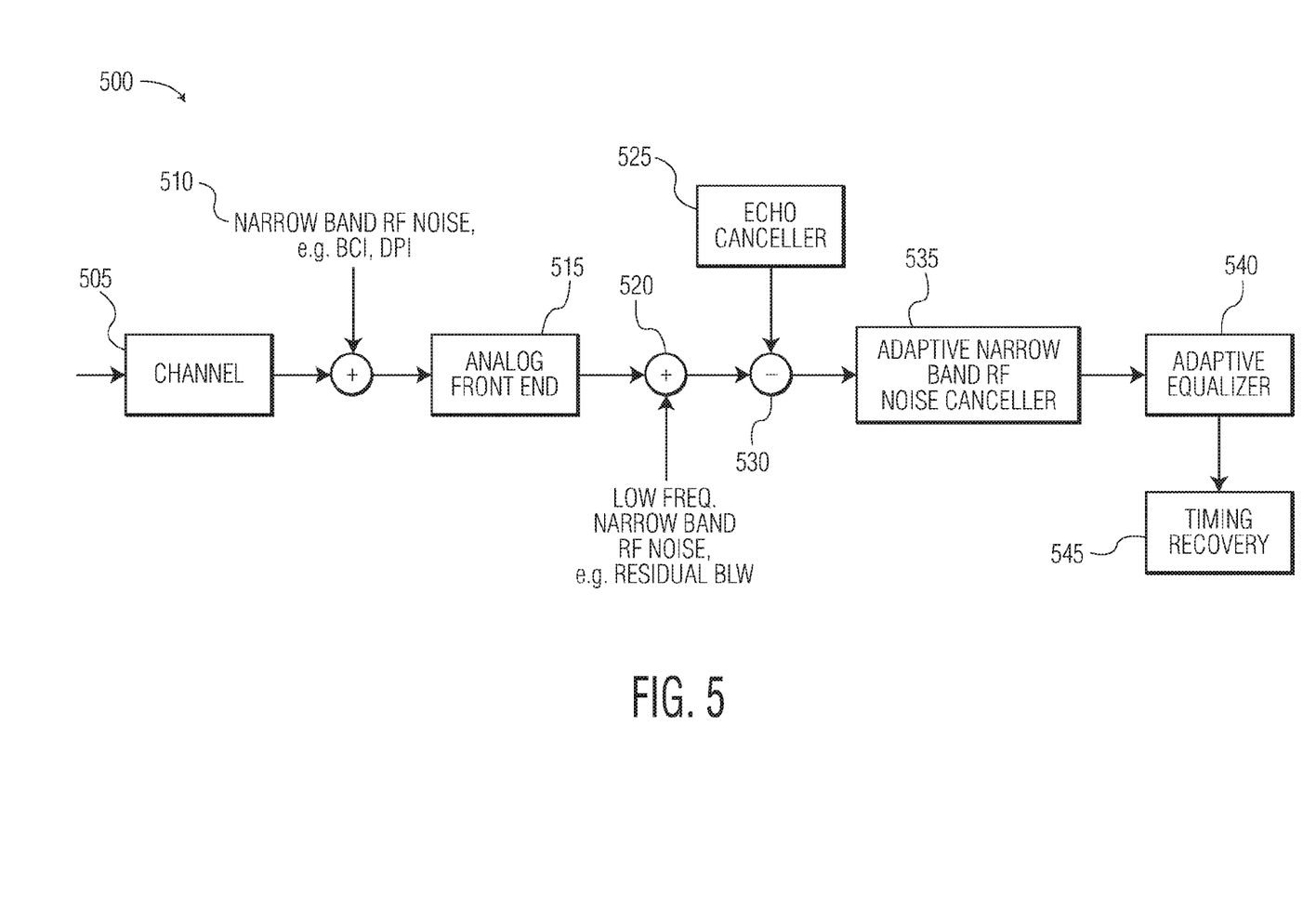
FIG. 5 illustrates an embodiment of adaptive noise cancellation.

FIG. 5 illustrates another embodiment of adaptive noise cancellation 500. Embodiment 500 may include channel 505, narrow band RF noise 510, analog front end 515, low frequency narrow band RF noise 520, echo canceller 525, subtractor 530, adaptive narrow band RF noise canceller 535, adaptive equalizer 540, and timing recovery 545.

In embodiment 500, noise may be removed by the noise canceller 535 after echo canceller 525, and before adaptive equalizer 540 and timing recovery 545. Noise canceller 535 may include the elements discussed in FIG. 3. A signal may enter channel 505, which may be connector 110. The signal may be distorted by narrow band RF noise 510 before entering analog front end 515. Narrow band RF noise 510 may similarly be BCI or DPI, for example. Analog front end 515 may be part of system 115. The signal may then be modified by echo canceller 525 before entering noise canceller 535.

After exiting the noise canceller 535, the signal may have multi-tone narrow band RF noise suppressed. The signal may then be modified by adaptive equalizer 540. Adaptive equalizer 540 may be any type of equalizer as described above such as a linear equalizer or a decision feedback equalizer. The adaptive equalizer 540 may update the equalizer parameters, for example, filter coefficients. The adaptive equalizer 540 may use, for example, cost functions such as Mean Squared Error (MSE). Next, carrier recovery may be performed in timing recovery 545. In timing recovery 545, frequency and phase differences between a carrier wave and the receiver's oscillator may be estimated and compensated for in order to complete demodulation.

Figure 6:
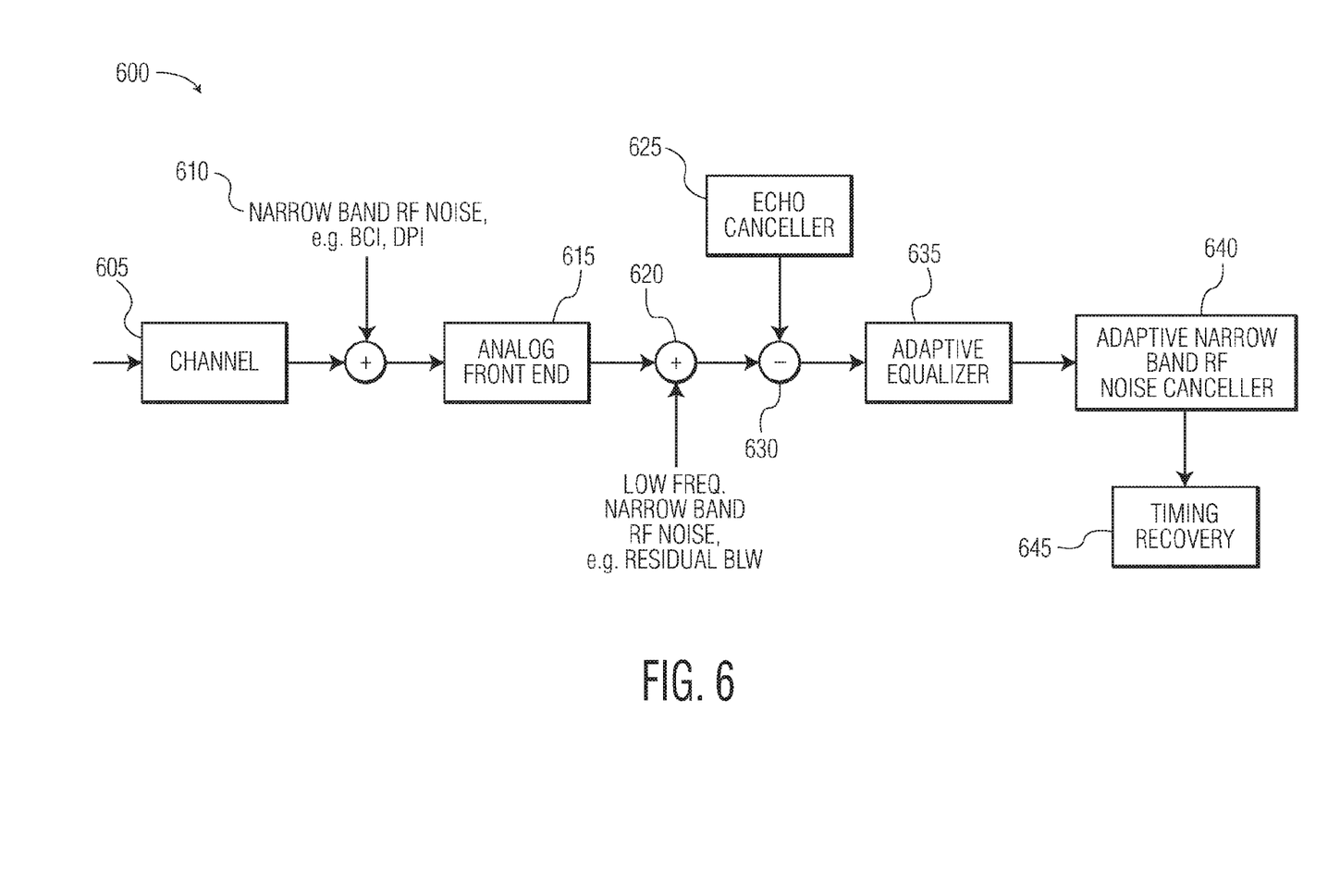
FIG. 6 illustrates an embodiment of adaptive noise cancellation.

FIG. 6 illustrates an embodiment of adaptive noise cancellation 600. Embodiment 600 may include channel 605, narrow band RF noise 610, analog front end 615, low frequency narrow band RF noise 620, echo canceller 625, subtractor 630, adaptive narrow band RF noise canceller 640, and timing recovery 645.

RF noise may be cancelled after the echo cancellation 625 and adaptive equalization 635 takes place in embodiment 600. Noise cancellation may be more effective after echo and ISI are removed. The tradeoff is that echo and equalizer convergence may be longer.

A simulation was performed with plot eye diagrams attached to the echo canceller both before and after the noise canceller. Narrow band noise with the following characteristics were used:

RF Noise-1: 500 kHz-200 mVpp before the analog front end input.
RF Noise-2: 800 kHz-100 mVpp after the analog front end output.
Total 300 mVpp of RF Noise The results of the simulation illustrated the following benefits:

Better echo cancellation where less residual will be left;
Better ISI cancellation where less ISI residual will be left;
Improved SNR margins;
Convergence of adaptive echo and equalizer with increased speed; and
Quicker start-up time.

Figure 7:
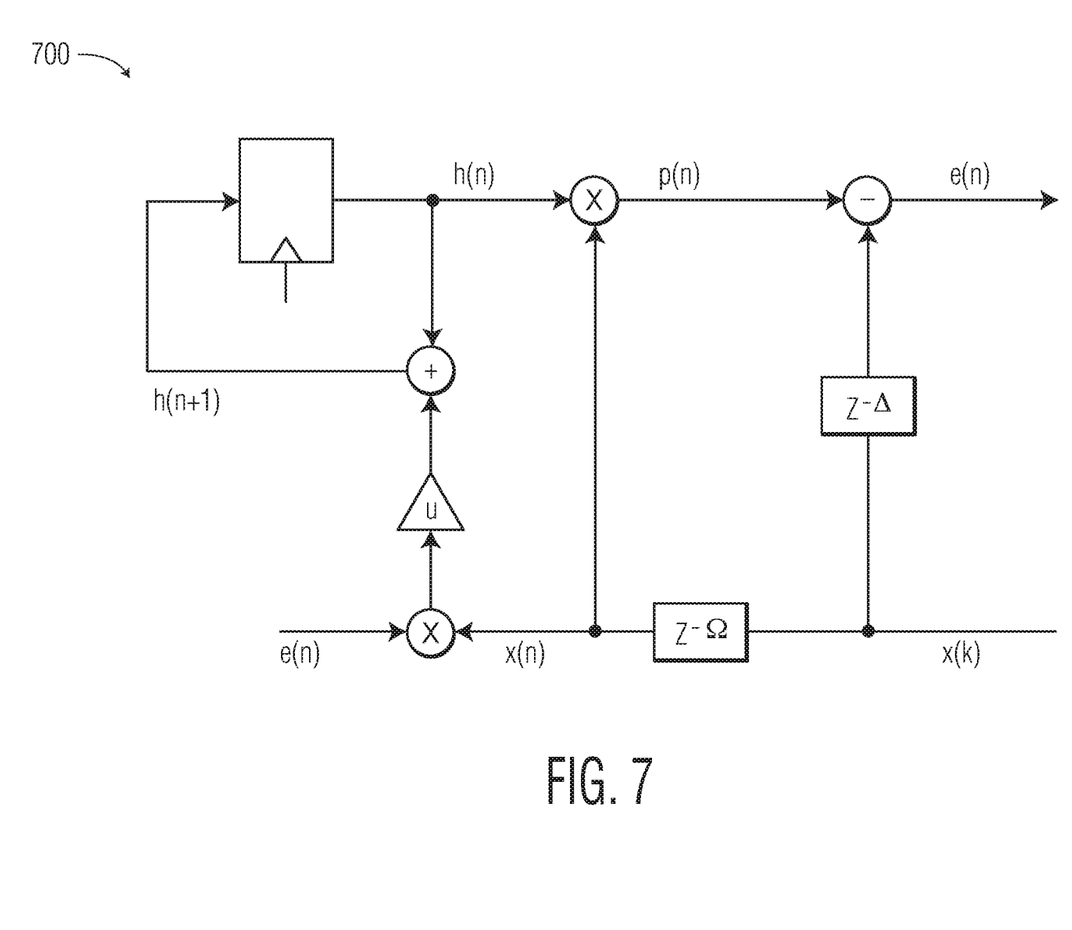
FIG. 7 illustrates an embodiment of adaptive algorithm.

FIG. 7 illustrates an embodiment of adaptive algorithm 700. The received symbol x(k) may be delayed by delayer $\Omega$ and $\Delta$. x(n) may be multiplied with e(n) and later multiplied with a step size (gain) u. Each new value of coefficient h(n+1) may be stored in a register. Current coefficient h(n) may be multiplied with x(n) and results in p(n). Delayed received symbol x(k), using delayer $\Delta$, may be subtracted from p(n) and result in error e(n). These same steps above may repeat for each clock cycle.

It should be apparent from the foregoing description that various embodiments of the invention may be implemented in hardware. Furthermore, various embodiments may be implemented as instructions stored on a non-transitory machine-readable storage medium, such as a volatile or non-volatile memory, which may be read and executed by at least one processor to perform the operations described in detail herein. A machine-readable storage medium may include any mechanism for storing information in a form readable by a machine, such as a personal or laptop computer, a server, or other computing device. Thus, a non-transitory machine-readable storage medium excludes transitory signals but may include both volatile and non-volatile memories, including but not limited to read-only memory (ROM), random-access memory (RAM), magnetic disk storage media, optical storage media, flash-memory devices, and similar storage media.

It should be appreciated by those skilled in the art that any block diagrams herein represent conceptual views of illustrative circuitry embodying the principles of the invention. Similarly, it will be appreciated that any flow charts, flow diagrams, state transition diagrams, pseudo code, and the like represent various processes which may be substantially represented in machine readable media and so executed by a computer or processor, whether or not such computer or processor is explicitly shown.

Although the various embodiments have been described in detail with particular reference to certain aspects thereof, it should be understood that the invention is capable of other embodiments and its details are capable of modifications in various obvious respects. As is readily apparent to those skilled in the art, variations and modifications can be effected while remaining within the spirit and scope of the invention. Accordingly, the foregoing disclosure, description, and figures are for illustrative purposes only and do not in any way limit the invention, which is defined only by the claims.

What is claimed is:

1. A device for reducing noise in a received signal, the device comprising:
   a memory;
   a processor configured to receive a signal containing narrow band noise which was transmitted over a channel and received at an analog front end, add two separate delays to the received signal to generate a first delayed signal and a second delayed signal, wherein the two separate delays are tuned to achieve correlation and the first delayed signal is cross-correlated with the second delayed signal, apply an adaptive noise cancellation using the first delayed signal and the second delayed signal to estimate the narrow band noise, and remove the narrow band noise based upon the estimated narrow band noise.

2. The device of claim 1, wherein the processor is further configured to remove multi-tone narrow band radio frequency noise.

3. The device of claim 1, wherein the processor is further configured to remove the noise prior to performing echo cancelation and adaptive equalization.

4. The device of claim 1, wherein the processor is further configured to remove the noise after performing echo cancellation and prior to performing adaptive equalization.

5. The device of claim 1, wherein the processor is further configured to remove the noise after performing echo cancelation and adaptive equalization but prior to performing a timing recovery.

6. The device of claim 1, wherein the processor is further configured to remove the noise after performing a first echo cancellation and prior to performing a second echo cancelation.

7. The device of claim 1, wherein the processor is further configured to remove the noise prior to performing echo cancelation, adaptive equalization, and timing recovery.

8. A method for reducing noise in a received signal, the method comprising:
   receiving a signal containing narrow band noise which was transmitted over a channel and received at an analog front end;
   adding two separate delays to the received signal to generate a first delayed signal and a second delayed signal, wherein the two separate delays are tuned to achieve correlation and the first delayed signal is cross-correlated with the second delayed signal;
   applying an adaptive noise cancellation using the first delayed signal and the second delayed signal to estimate the narrow band noise; and
   removing the narrow band noise based upon the estimated narrow band noise.

9. The method of claim 8, further comprising:
   removing, with a processor, multi-tone narrow band radio frequency noise.

10. The method of claim 8, further comprising:
    removing, with a processor, the noise prior to performing echo cancelation and adaptive equalization.

11. The method of claim 8, further comprising:
    removing, with a processor, the noise after performing echo cancellation and prior to performing adaptive equalization.

12. The method of claim 8, further comprising:
    removing, with a processor, the noise after performing echo cancelation and adaptive equalization but prior to performing a timing recovery.

13. The method of claim 8, further comprising:
    removing, with a processor, the noise after performing a first echo cancellation and prior to performing a second echo cancelation.

14. The method of claim 8, further comprising:
    removing, with a processor, the noise prior to performing echo cancelation, adaptive equalization and timing recovery.

15. A non-transitory machine-readable storage medium encoded with instructions for execution of a method for reducing noise in a received signal, by a processor in a receiver comprising:
    instructions for receiving a signal containing narrow band noise which was transmitted over a channel and received at an analog front end;
    instructions for adding two separate delays to the received signal to generate a first delayed signal and a second delayed signal, wherein the two separate delays are tuned to achieve correlation and the first delayed signal is cross-correlated with the second delayed signal;
    instructions for applying an adaptive noise cancellation using the first delayed signal and the second delayed signal to estimate the narrow band noise; and
    instructions for removing the narrow band noise based upon the estimated narrow band noise.

16. The non-transitory machine-readable storage medium of claim 15, further comprising:
    instructions for removing multi-tone narrow band radio frequency noise.

17. The non-transitory machine-readable storage medium of claim 15, further comprising:
    instructions for removing the noise prior to performing echo cancelation and adaptive equalization.

18. The non-transitory machine-readable storage medium of claim 15, further comprising:
    instructions for removing the noise after performing echo cancellation and prior to performing adaptive equalization.

* * * * *